(12) United States Patent
Hosaka et al.

(10) Patent No.: US 10,006,961 B2
(45) Date of Patent: Jun. 26, 2018

(54) TRANSFER METHOD AND INSPECTION SYSTEM

(71) Applicant: Tokyo Electron Limited, Tokyo (JP)

(72) Inventors: Hiroki Hosaka, Yamanashi (JP); Masahiko Akiyama, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 102 days.

(21) Appl. No.: 14/869,896

(22) Filed: Sep. 29, 2015

(65) Prior Publication Data

US 2016/0091562 A1 Mar. 31, 2016

(30) Foreign Application Priority Data

Sep. 29, 2014 (JP) .................. 2014-198444

(51) Int. Cl.
*G01R 31/28* (2006.01)

(52) U.S. Cl.
CPC ...... *G01R 31/2893* (2013.01); *G01R 31/2867* (2013.01); *G01R 31/2874* (2013.01)

(58) Field of Classification Search
CPC .................. G01R 31/2893; G01R 31/2867
See application file for complete search history.

(56) References Cited

U.S. PATENT DOCUMENTS

| | | | |
|---|---|---|---|
| 6,762,616 B2 * | 7/2004 | Kawaguchi | G01R 31/2868 324/750.14 |
| 8,905,700 B2 * | 12/2014 | Obikane | H01L 21/67778 414/411 |
| 2015/0168449 A1 | 6/2015 | Yamada | |

FOREIGN PATENT DOCUMENTS

| | | |
|---|---|---|
| JP | 3783075 | 3/2006 |
| JP | 4789821 B2 | 7/2011 |
| JP | 2013-254812 | 12/2013 |
| KR | 10-2008-0088423 A | 10/2008 |

* cited by examiner

*Primary Examiner* — Noam Reisner

(57) ABSTRACT

In a transfer method for transferring a substrate in an inspection system configured to perform a test on electrical characteristics of the substrate, the inspection system including an inspection unit including a plurality of test devices configured to perform the test on the electrical characteristics of a substrate, a loader unit configured to mount a cassette which accommodates a plurality of substrates, and a transfer device configured to transfer a substrate between the inspection unit and the loader unit, an inspected substrate is received by the transfer device from the inspection unit. The inspected substrate received from the inspection unit is transferred toward the loader unit in a state where an opening portion of a transfer arm container of the transfer device. Then, the inspected substrate is delivered to the loader unit.

16 Claims, 8 Drawing Sheets

TRANSFER METHOD AND INSPECTION SYSTEM

CROSS-REFERENCE TO RELATED APPLICATIONS

This application claims priority to Japanese Patent Application No. 2014-198444 filed on Sep. 29, 2014, the entire contents of which are incorporated herein by reference.

FIELD OF THE INVENTION

The present invention relates to an inspection system used for inspection of a substrate such as a semiconductor wafer or the like, and a transfer method for transferring the substrate in the inspection system.

BACKGROUND OF THE INVENTION

A test on the electrical characteristics of a device such as a semiconductor memory and an integrated circuit formed on the semiconductor wafer is performed by using a probe device. The probe device typically includes an inspection unit for performing a test of the semiconductor wafer and a loader unit provided adjacent to the inspection unit. In the inspection unit, a low temperature test or a high temperature test may be performed in a state where the semiconductor wafer has been cooled or heated, in addition to a room temperature test. The loader unit includes an accommodation unit which accommodates a cassette containing a plurality of semiconductor wafers, and a transfer device having a plurality of transfer arms for transferring the semiconductor wafers between the cassette and the inspection unit. The transfer device unloads the semiconductor wafer from the cassette by using the transfer arm and transfers the semiconductor wafer to the inspection unit. Further, the transfer device receives an inspected semiconductor wafer from the inspection unit and transfers the inspected semiconductor wafer to an original place in the cassette.

When the low temperature test is performed, the semiconductor wafer is cooled to minus several tens of degrees in the inspection unit maintained in a low dew point environment. When the low temperature test in the inspection unit is completed, the inspected semiconductor wafer is unloaded from the inspection unit by the transfer device and returned into the cassette of the loader unit. At this time, if condensation or congelation occurs in the semiconductor wafer during the transfer of the semiconductor wafer from the inspection unit to the cassette of the loader unit or in the semiconductor wafer within the cassette, this may cause a deffect in the device formed on the semiconductor wafer. In order to prevent such condensation and congelation after the low temperature test, there has been suggested a technique that provides a shield container for covering the transfer arm and a unit for supplying a dry gas into the shield container (see, e.g., Japanese Patent No. 3783075).

Recently, in order to rapidly perform a test with respect to a plurality of semiconductor wafers, there has been suggested an inspection system including a loader unit in which a plurality of cassettes can be installed and a plurality of test devices (see, e.g., Japanese Patent Application Publication No. 2013-254812). The inspection system is configured to transfer the semiconductor wafer between the test devices and the cassettes.

In a probe device disclosed in Japanese Patent Application Publication No. 3783075, the semiconductor wafer is transferred between one inspection unit and the cassette of the loader unit. While a new semiconductor wafer is being inspected, a semiconductor wafer that has been inspected just before the inspection of the new semiconductor wafer may stand by on the transfer arm of the transfer device for a predetermined period of time. During this standby status, a dry air is supplied into the shield container to prevent condensation and congelation in the semiconductor wafer. Moreover, by providing a sufficient standby time, a temperature of the inspected semiconductor wafer can be increased to a temperature level at which condensation and congelation does not occur, when the semiconductor wafer is delivered to the cassette.

In the inspection system having the test devices disclosed in Japanese Patent Application Publication No. 2013-254812, in order to improve a throughput, it is important to extremely reduce an idle time of the transfer devices. Specifically, in the above inspection system, it is required that the inspected semiconductor wafer is instantly unloaded from the test device, exchanged with an uninspected semiconductor wafer, and rapidly delivered to the loader unit, and the inspection system is prepared for the transfer of another semiconductor wafer. For this reason, in the above inspection system, when the low temperature test is performed, it is difficult to secure a suifficient standby time on the transfer arm for preventing condensation and congelation in the semiconductor wafer. Further, this problem becomes more difficult to be solved as the number of the test devices that are transfer destinations increases. That is, when the low temperature test is performed in the inspection system having a plurality of test devices, a conventional method is insufficient to effectively prevent condensation and congelation that occur during the transfer. Accordingly, a new method is required.

SUMMARY OF THE INVENTION

In view of the above, the present invention provides an inspection system having a plurality of test devices which can effectively prevent condensation and congelation from occurring in a semiconductor wafer during the transfer of the semiconductor wafer without lowering a throughput.

In accordance with an aspect, there is provided a transfer method for transferring a substrate in an inspection system configured to perform a test on electrical characteristics of the substrate. The inspection system includes: an inspection unit including a plurality of test devices configured to perform the test on the electrical characteristics of a substrate; a loader unit configured to mount a cassette which accommodates a plurality of substrates; and a transfer device configured to transfer a substrate between the inspection unit and the loader unit. The transfer device includes: a transfer arm configured to be rotatable in a horizontal plane and to hold a substrate; a transfer arm container having an opening portion through which the transfer arm moves forward and backward and configured to be rotatable in a horizontal plane and to cover the transfer arm; a shield member configured to switch the opening portion between an open state and a closed state; and a gas introduction mechanism configured to introduce a dry gas into the transfer arm container. The transfer method includes: receiving an inspected substrate from the inspection unit; transferring the inspected substrate received from the inspection unit toward the loader unit in a state where the opening portion is shielded by the shield member; and delivering the inspected substrate to the loader unit.

In accordance with another aspect, there is provided an inspection system for performing a test on electrical characteristics of a substrate.

The inspection system includes: an inspection unit including a plurality of test devices configured to perform the test on the electrical characteristics of a substrate; a loader unit configured to mount a cassette which accommodates a plurality of substrates; a transfer device configured to transfer a substrate between the inspection unit and the loader unit; and a controller configured to control the transfer device.

The transfer device includes: a transfer arm configured to be rotatable in a horizontal plane and to hold the substrate; a transfer arm container configured to cover the transfer arm and having an opening portion through which the transfer arm moves forward and backward, the transfer arm container being rotatable in a horizontal plane; a shield member configured to switch the opening portion between an open state and a closed state; and a gas introduction mechanism configured to introduce a dry gas into the transfer arm container.

The controller includes: a rotation control unit configured to control a rotation of the transfer arm and the transfer arm container; and a gas introduction control unit configured to control an introduction of the dry gas performed by the gas introduction mechanism.

When the transfer device receives an inspected substrate from the inspection unit, the rotation control unit sets the transfer arm and the transfer arm container at a first rotation position.

When the inspected substrate received from the inspection unit is transferred toward the loader unit, the rotation control unit sets the transfer arm container at a second rotation position which is different from the first rotation position and at which the opening portion is shielded by the shield member.

When the inspected substrate is delivered to the loader unit, the rotation control unit sets the transfer arm and the transfer arm container at a third rotation position which is different from the first and the second rotation position.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with respect to the accompanying drawings.

Figure 1:
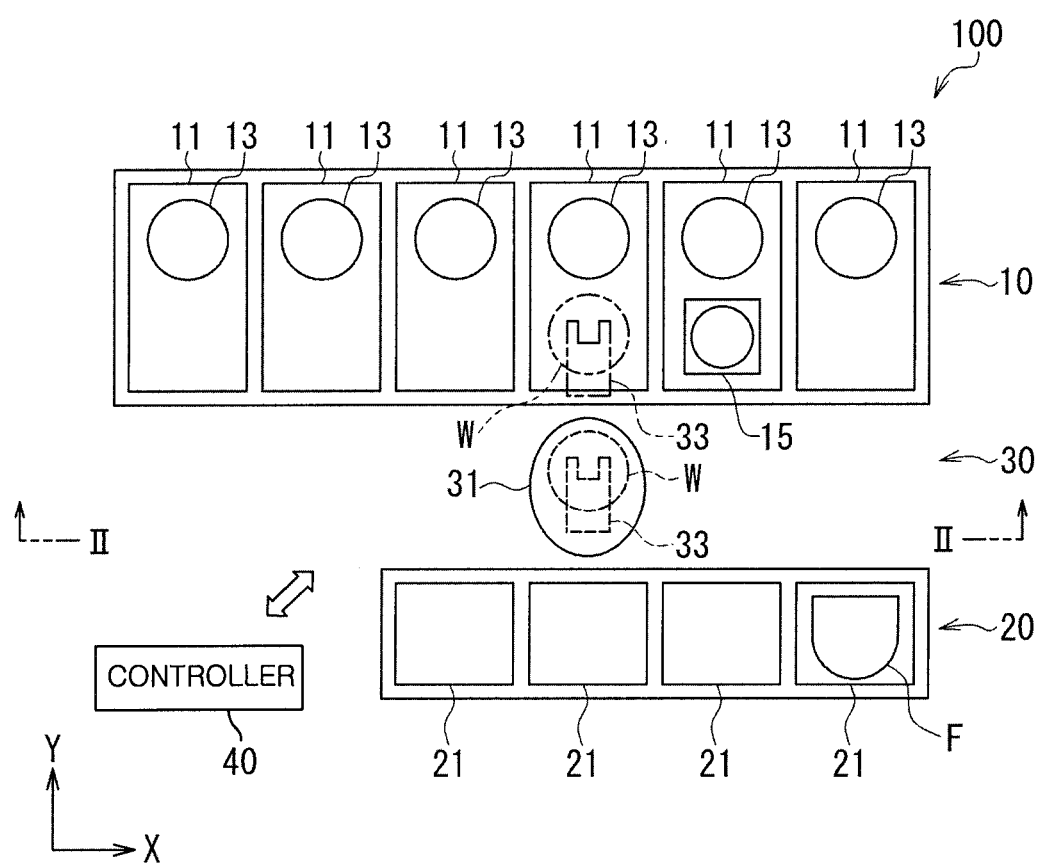
FIG. 1 is a plan view showing a schematic configuration of an inspection system in accordance with an embodiment of the present invention.
Figure 2:
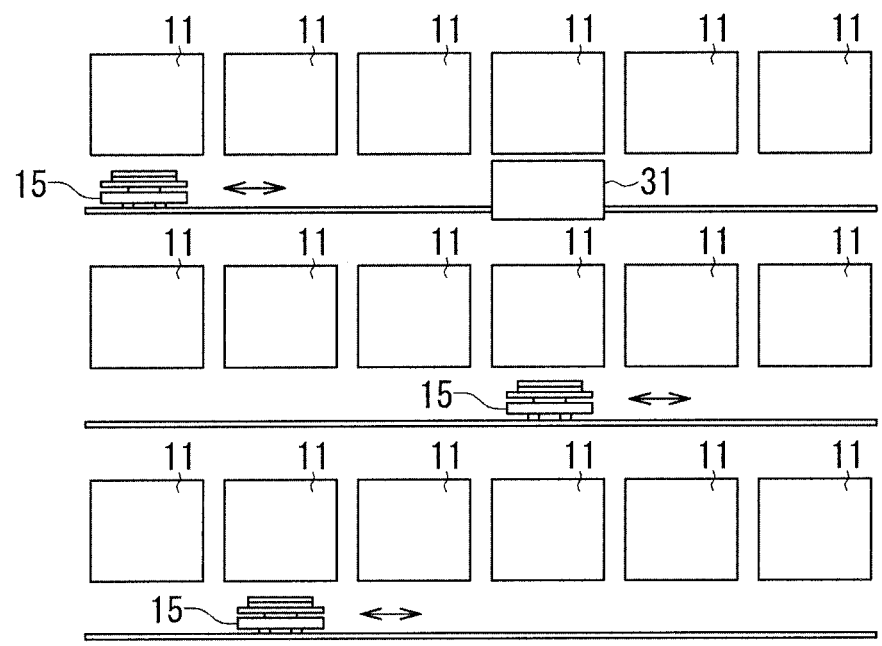
FIG. 2 is a cross sectional view taken along a line II-II shown in FIG. 1.

FIG. 1 is a plan view showing a schematic configuration of an inspection system in accordance with an embodiment of the present invention. FIG. 2 is a cross-sectional view of the inspection system taken along a line II-II in FIG. 1. The inspection system 100 performs an electrical characteristic test of a device formed on a semiconductor wafer (hereinafter, simply referred to as "wafer") W that is a substrate. In FIG. 1, the inspection system 100 includes an inspection unit 10 having a plurality of test devices, a loader unit 20, a transfer unit 30 provided between the inspection unit 10 and the loader unit 20, and a controller 40 for controlling each of the units.

(Inspection Unit)

The inspection unit 10 has a plurality of test sections 11 for performing an electrical characteristic test of a device. A test device 13 having an interface (not shown) for wafer inspection is arranged in each of the test sections 11. As shown in FIG. 2, in the inspection unit 10, six test sections 11 are arranged in each of three stages of an upper stage, a middle stage and a lower stage. Thus, total eighteen test sections 11 are provided. In the present embodiment, a low temperature test of the device formed on the wafer W is performed in each of the test sections 11. The inside of the test sections 11 is maintained in a low dew point environment by, e.g., introducing a dry air. The number and the arrangement of the test sections 11 in the inspection unit 10 are not limited to those shown in FIGS. 1 and 2.

The inspection unit 10 includes a transfer stage 15 which is movable in X-direction in FIGS. 1 and 2. The transfer stage 15 is arranged at each of the upper stage, the middle stage and the lower stage. An uninspected wafer W is loaded into and an inspected wafer W is unloaded from each test section 11 of each stage through the transfer stage 15. However, the transfer stage 15 may not be provided, and the loading of the uninspected wafer W and the unloading of the inspected wafer W may be directly performed between a transfer device 31 (which will be later described) of the transfer unit 30 and each of the test sections 11.

(Loader Unit)

The loader unit 20 performs loading and unloading of the wafer W, a wafer tray, a probe card and the like. The loader unit 20 is divided by a plurality of loading/unloading stages 21. Each of the loading/unloading stages 21 is configured to mount thereon FOUP F serving as a cassette. Although not shown, the loader unit 20 may have an alignment device for performing a position alignment of the wafer W, and a needle mark test device for performing a needle mark test of the wafer W after inspection.

(Transfer Unit)

At the transfer unit 30, a transfer device 31 for transferring the wafer W is provided. The transfer device 31 is configured to be movable in X, Y and Z directions in FIGS. 1 and 2. The transfer device 31 transfers an uninspected wafer W received from the FOUP F to the transfer stage 15 of the inspection unit 10. Further, the transfer device 31 receives an inspected wafer W from the transfer stage 15 of the inspection unit 10 and transfers the wafer W to, e.g., the FOUP F of the loader unit 20. The number of the transfer device 31 is not limited to one but may be plural.

Figure 3:
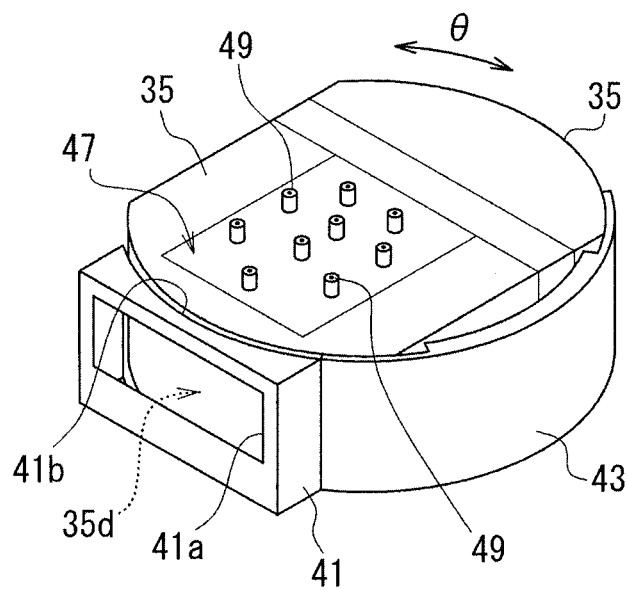
FIG. 3 is a perspective view showing an external configuration of an upper portion of a transfer device.
Figure 4:
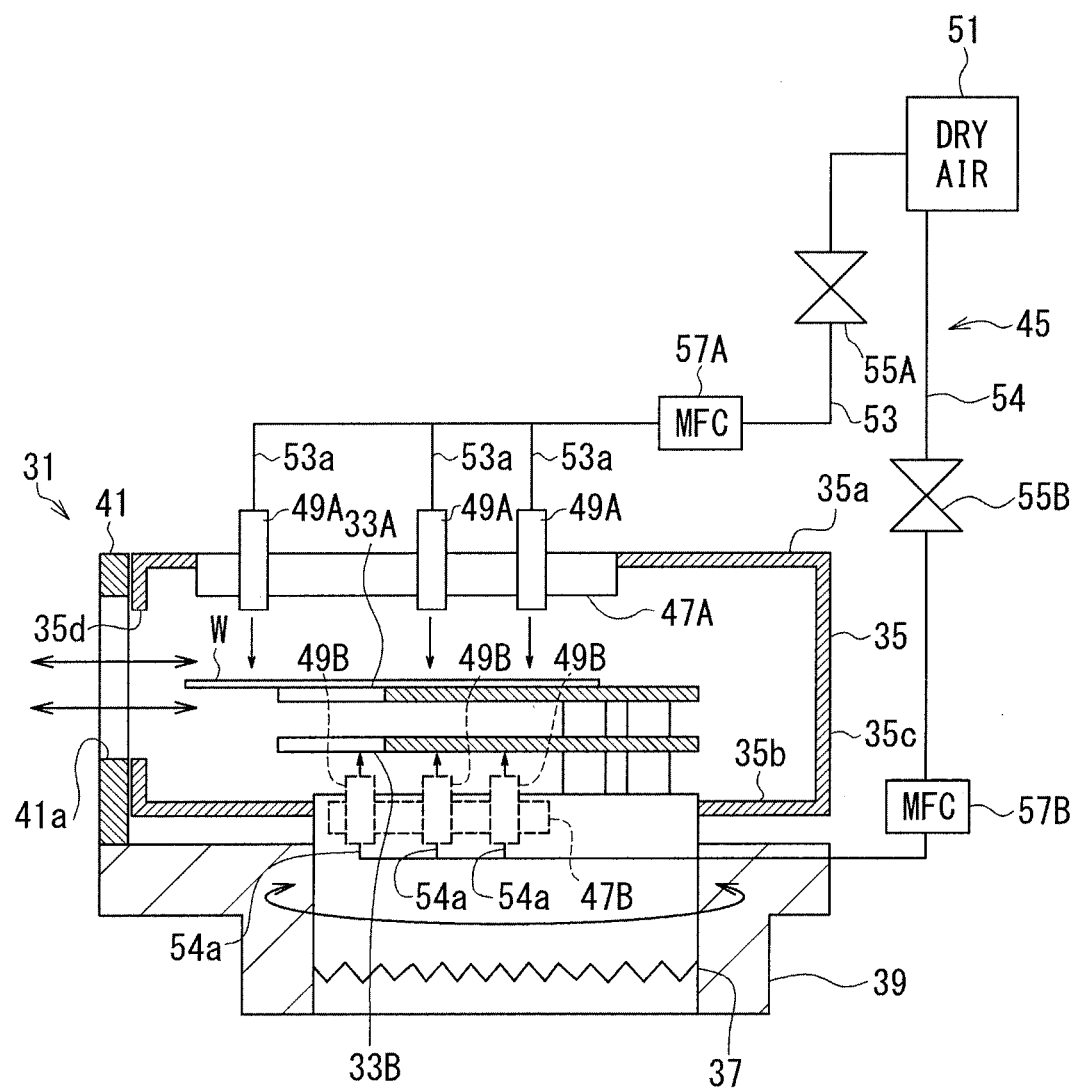
FIG. 4 is a vertical sectional view of the transfer device.

Hereinafter, a detailed configuration of the transfer device 31 will be described with reference to FIGS. 3 and 4. FIG. 3 is a perspective view showing an external configuration of an upper portion of the transfer device 31. FIG. 4 is a vertical sectional view schematically showing the transfer device 31. As shown in FIGS. 3 and 4, the transfer device 31 includes: transfer arms 33A and 33B arranged at upper and lower stages to hold the wafer W; a cover 35 serving as a transfer arm container that covers the transfer arms 33A and 33B; a rotation driving unit 37 for synchronously rotating (θ rotation) the transfer arms 33A and 33B and the cover 35 in a horizontal plane; and a base unit 39 which supports the transfer arms 33A and 33B, the cover 35 and the rotation driving unit 37. Further, the transfer device 31 includes a frame-shaped member 41 and a shield wall 43 which are arranged outside the cover 35. Furthermore, the transfer device 31 includes a gas introduction mechanism 45 for introducing a dry gas into the cover 35.

(Transfer Arm)

A pair of transfer arms 33A and 33B (hereinafter, referred to also as "transfer arm 33" when the two arms need not to be distinguished) is capable of independently moving forward and backward in the horizontal plane by a slide driving unit (not shown). The transfer arm 33 in a forward state transfers the wafer W between members such as the transfer stage 15 and the FOUP F. The transfer arm 33 in a backward state allows the wafer W to be accommodated in the cover 35.

(Cover)

The cover 35 includes a ceiling portion 35a, a bottom portion 35b, and four side portions 35c. A gas introduction unit 47A for introducing a dry gas into the cover 35 is provided at the ceiling portion 35a of the cover 35. Further, a gas introduction unit 47B for introducing a dry gas into the cover 35 is provided at the bottom portion 35b of the cover 35. The gas introduction unit 47A has a plurality of inlet ports 49A connected to the gas introduction mechanism 45. The gas introduction unit 47B has a plurality of inlet ports 49B connected to the gas introduction mechanism 45. An opening portion 35d through which the transfer arm 33 that holds the wafer W moves back and forth is formed at one side portion 35c of the cover 35. The cover 35 is made of, e.g., metal, synthetic resin or the like. The cover 35 may be formed by combining a plurality of members.

(Rotation Driving Unit)

The rotation driving unit 37 rotates (θ rotation) the transfer arm 33 and the cover 35 in a horizontal plane. The rotation driving unit 37 horizontally rotates the transfer arm 33 and the cover 35 without rotating the base unit 39, the frame-shaped member 41 fixed to the base unit 39, and the shield wall 43. Accordingly, the rotation position of the transfer arm 33 and the cover 35 relative to the frame-shaped member 41 and the shield wall 43 is changed by the rotation driving unit 37.

(Base Unit)

The base unit 39 supports the transfer arm 33, the cover 35, the rotation driving unit 37, the frame-shaped member 41 and the shield wall 43. The base unit 39 has a driving mechanism (not shown). The transfer device 31, as a whole, is configured to be movable in X, Y and Z directions (see FIGS. 1 and 2) by the driving mechanism.

(Frame-Shaped Member)

The frame-shaped member 41 is a partial cover fixed to the base unit 39. The frame-shaped member 41 includes an opening portion 41a through which the transfer arm 33 is inserted. When the wafer W is transferred from and to the transfer stage 15 of the inspection unit 10, the frame-shaped member 41 shields, from the outside, a space where the transfer arm 33 that holds the wafer W moves back and forth. Further, the frame-shaped member 41 includes a notch portion 41b of an arc-shape along the outer periphery of the cover 35. The notch portion 41b is positioned close to the cover 35 with a slight gap therebetween. The frame-shaped member 41 is made of, e.g., metal, synthetic resin or the like.

(Shield Wall)

The shield wall 43 is fixed to the base unit 39. The shield wall 43 is a shield member that switches the opening portion 35d of the cover 35 between an open state and a closed state. When the transfer arm 33 delivers the wafer W between members such as the transfer stage 15, the FOUP F, and the like, the shield wall 43 is disposed such that the shield wall 43 does not overlap with the opening portion 35d of the cover 35. When the transfer arm 33 is positioned at a specific rotation position, the shield wall 43 overlaps with the opening portion 35d of the cover 35 and shields the opening portion 35d. In this regard, detailed description will be made later. The shield wall 43 is made of, e.g., metal, synthetic resin or the like.

(Gas Introduction Mechanism)

The gas introduction mechanism 45 introduces a dry gas into the cover 35 through the gas introduction units 47A and 47B of the cover 35. As shown in FIG. 4, the gas introduction mechanism 45 includes a gas supply source 51, a supply line 53 that connects the gas supply source 51 to the inlet ports 49A, an opening/closing valve 55A arranged at the supply line 53, and a mass flow controller (MFC) 57A for controlling a flow rate. The gas introduction mechanism 45 further includes a supply line 54 that connects the gas supply source 51 to the inlet ports 49B, an opening/closing valve 55B arranged at the supply line 54, and a mass flow controller (MFC) 57B for controlling a flow rate. A gas supplied from the gas supply source 51 is, e.g., a dry air, nitrogen gas, or the like. In FIG. 4, the gas supply source 51 supplies a dry air as a representative example of the dry gas. The supply line 53 branches a plurality of branch lines 53a, and the branch lines 53a are respectively connected to the inlet ports 49A. The supply line 54 branches a plurality of branch lines 54a, and the branch lines 54a are respectively connected to the inlet ports 49B. The supply lines 53 and 54 and the branch lines 53a and 54a may be made of, e.g., a flexible material. The gas introduction mechanism 45 switches the supply and stop of the dry gas by using the opening/closing valves 55A and 55B. Further, the gas introduction mechanism 45 introduces the dry gas into the cover 35 independently through the supply lines 53 and 54 while controlling a flow rate to a desired value by using the mass flow controller 57A and 57B.

(Controller)

Figure 5:
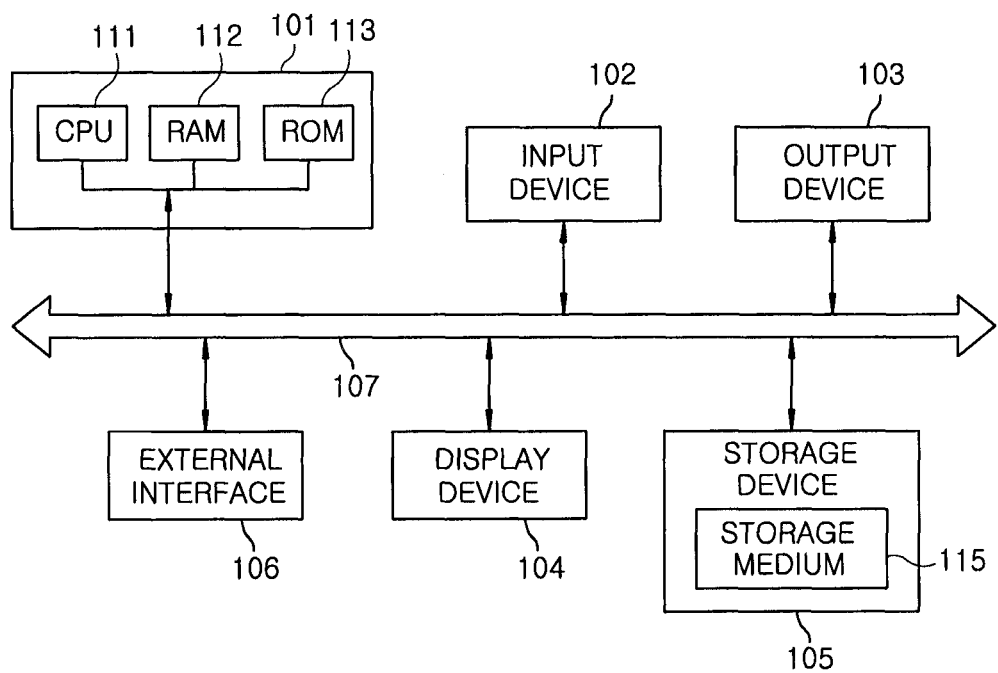
FIG. 5 is a view showing an example of a hardware configuration of a controller.

The components of the inspection system 100 are respectively connected to the controller 40 and controlled by the controller 40. The controller 40 is typically a computer. FIG. 5 shows an example of the hardware configuration of the controller 40 shown in FIG. 1. The controller 40 includes a main control unit 101, an input device 102 such as keyboard, mouse and the like, an output device 103 such as printer and the like, a display device 104, a storage device 105, an external interface 106, and a bus 107 that connects the above components to each other. The main control unit 101 includes a CPU (central processing unit) 111, a RAM (random access memory) 112, and a ROM (read only memory) 113. The storage device 105 may be of any type as long as it can store information. For example, the storage device 105 may be a hard disk device or an optical disk device. The storage device 105 writes information to a computer-readable storage medium 115, and reads information from the storage medium 115. The storage medium 115 may be of any type as long as it can store information. For example, the storage medium 115 may be a hard disk, an optical disk, a flash memory or the like. The storage medium 115 may store a recipe for the transfer method performed in the inspection system 100 of the present embodiment.

In the controller 40, the CPU 111 uses the RAM 112 as a work area and executes a program stored in the ROM 113 or the storage device 105. Accordingly, with respect to a plurality of wafers W in the inspection system 100 of the present embodiment, a test is performed on a device formed on each wafer W. Specifically, the controller 40 controls the respective components (e.g., the test device 13, the transfer stage 15, the transfer device 31 and the like) in the inspection system 100.

Figure 6:
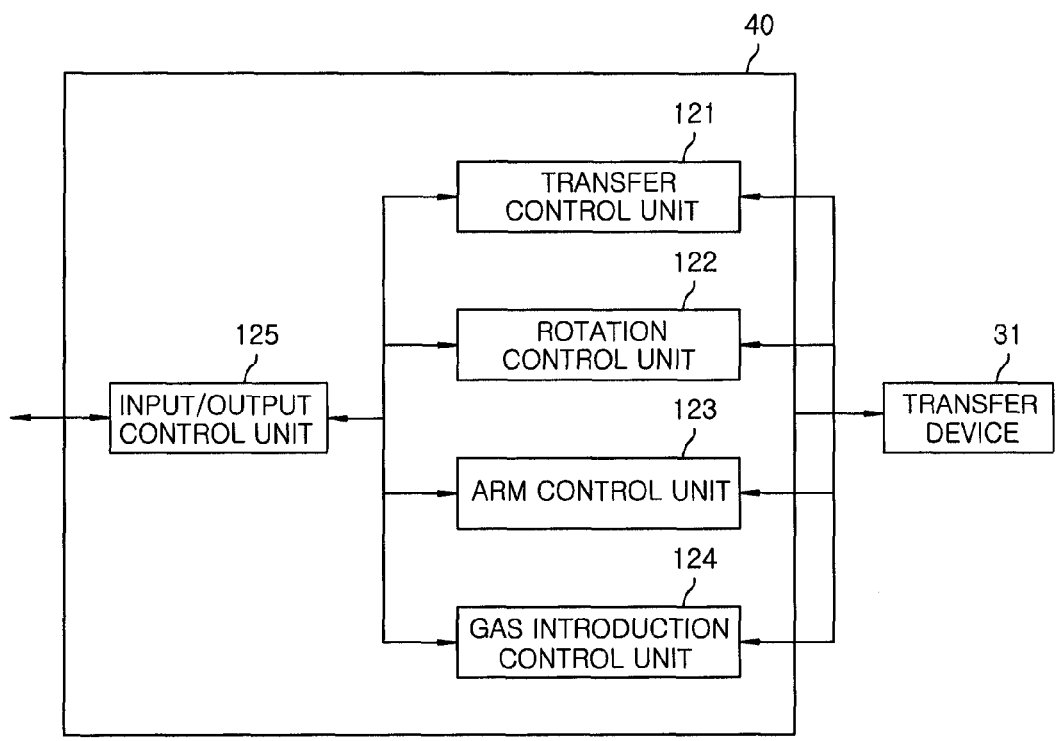
FIG. 6 is a functional block diagram of the controller related to a control of the transfer device.

FIG. 6 is a functional block diagram showing a function of the controller 40 related to a control of the transfer device 31. As shown in FIG. 6, the controller 40 includes a transfer control unit 121, a rotation control unit 122, an arm control unit 123, a gas introduction control unit 124, and an input/output control unit 125. These are implemented by the CPU 111 executing a software (program) stored in the ROM 113 or the storage device 105 while using the RAM 112 as a work area. The controller 40 has other functions as well, but description thereof will be omitted herein.

(Transfer Control Unit)

The transfer control unit 121 controls a movement of the transfer device 31 in X, Y and Z directions.

Specifically, the transfer control unit 121 sends a control signal to the driving mechanism (not shown) of the base unit 39 of the transfer device 31 to move the transfer device 31 at a predetermined speed in X, Y and Z directions or to stop the movement of the transfer device 31 at a predetermined position.

(Rotation Control Unit)

The rotation control unit 122 controls rotation ($\theta$ rotation) of the transfer arm 33 and the cover 35 of the transfer device 31 in the horizontal plane. Specifically, the rotation control unit 122 sends a control signal to the rotation driving unit 37 of the transfer device 31 to rotate the transfer arm 33 and the cover 35 at a predetermined speed in the horizontal plane or to stop the rotation of the transfer arm 33 and the cover 35 at a predetermined rotation angle.

(Arm Control Unit)

The arm control unit 123 controls the forward/backward movement of the transfer arm 33 of the transfer device 31. Specifically, the arm control unit 123 sends a control signal to the slide driving unit (not shown) of the transfer arm 33 of the transfer device 31 to individually move the transfer arm 33A or 33B forward or backward. Under the control of the arm control unit 123, the transfer arm 33 transfers the wafer W between the transfer stage 15 and the FOUP F.

(Gas Introduction Control Unit)

The gas introduction control unit 124 controls an introduction of a dry gas into the cover 35 by the gas introduction mechanism 45 and a stop of the introduction. Specifically, the gas introduction control unit 124 sends a control signal to the opening/closing valves 55A and 55B and the mass flow controllers 57A and 57B. Then, the switching of supply and stop of the dry gas into the cover, the changing of a flow rate, and the like are controlled by the opening and closing of the opening/closing valves 55A and 55B and a flow rate control through the mass flow controllers 57A and 57B.

The input/output control unit 125 controls an input from the input device 102, an output to the output device 103, a display on the display device 104, and an input/output of data from/to the outside through the external interface 106.

(Rotation Position)

Figure 7:
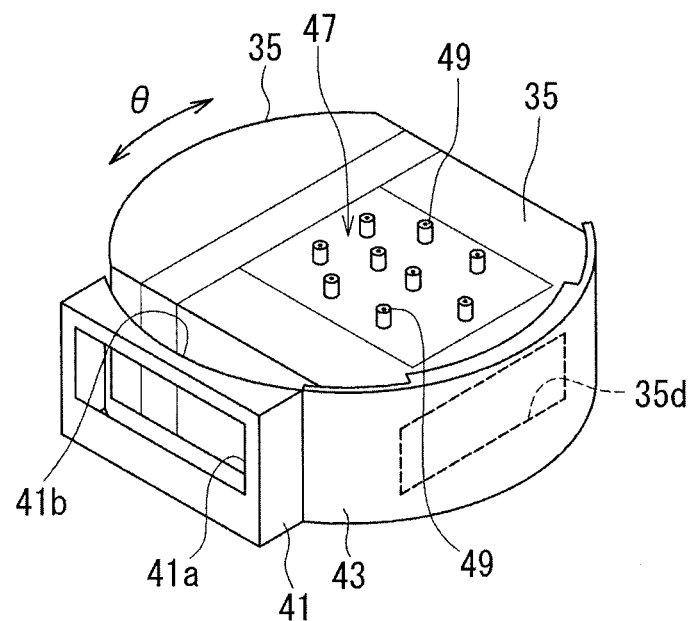
FIG. 7 is an explanatory view showing a state where a cover is horizontally rotated by a predetermined angle from a state of FIG. 3.
Figure 8:
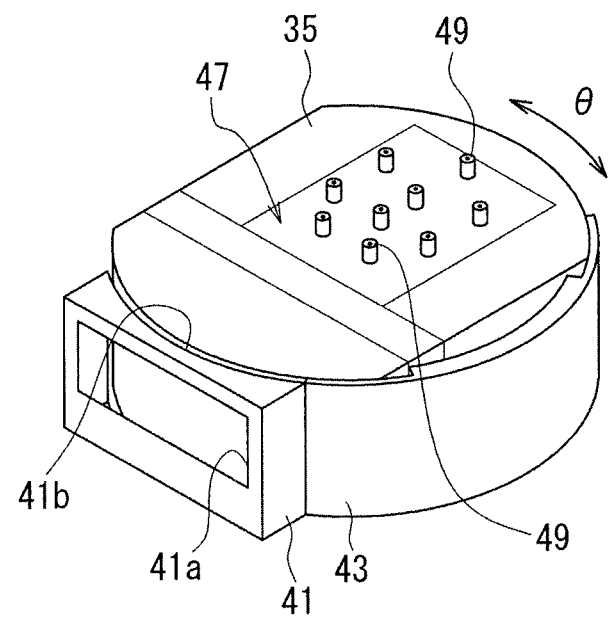
FIG. 8 is an explanatory view showing a state where the cover is horizontally rotated by a predetermined angle from a state of FIG. 7.

Next, a rotation position of the transfer arm 33 and the cover 35 will be described with reference to FIGS. 3, 7 and 8. As described above, under the control of the rotation control unit 122, the transfer arm 33 and the cover 35 are synchronously rotated ($\theta$ rotation) in the horizontal plane forward or backward by the rotation driving unit 37. FIGS. 7 and 8 respectively show states where the cover 35 is rotated by predetermined angles from a state shown in FIG. 3. In FIGS. 3, 7 and 8, a rotation direction of the transfer arm 33 and the cover 35 is indicated by a symbol $\theta$. Further, in FIGS. 3, 7 and 8, the cover 35 is only shown in appearance but the transfer arm 33 in the cover 35 is also synchronously rotated with the cover 35.

If assuming that a state of FIG. 3 is an initial state, FIG. 7 shows a state where the cover 35 has been horizontally rotated by an angle $\theta 1$ (e.g., 90°) in a counterclockwise direction from the initial state. Further, FIG. 8 shows a state where the cover 35 has been horizontally rotated by an angle $\theta 2$ (e.g., 90°) in a counterclockwise direction from the rotation position of FIG. 7. That is, the rotation position of FIG. 8 is a position where the cover 35 has been horizontally rotated by $\theta 1+\theta 2$ (e.g., 180°) from the initial state of FIG. 3.

The initial state of FIG. 3 is assumed to be a position where the transfer device 31 receives an inspected wafer W from the transfer stage 15 of the inspection unit 10. This position is referred to as a first rotation position in the present embodiment. At the first rotation position, the opening portion 35$d$ of the cover 35 overlaps with the opening portion 41$a$ of the frame-shaped member 41 fixed to the base unit 39, and the transfer arm 33 can move forward and backward through the opening portion 35$d$ and the opening portion 41$a$.

The rotation position of FIG. 7 is a rotation position at which the inspected wafer W received from the transfer stage 15 of the inspection unit 10 is transferred toward the loader unit 20. This position is referred to as a second rotation position in the present embodiment. At the second rotation position, the shield wall 42 fixed to the base unit 39 overlaps with the opening portion 35$d$ of the cover 35 to close the opening portion 35$d$. Accordingly, an ambient air including moisture is difficult to move into the cover 35, and thus condensation and congelation are prevented from being generated in the inspected wafer W having a low temperature. Further, the opening portion 35$d$ is closed by the shield wall 43, so that it is easy to maintain the inside of the cover 35 to a dry atmosphere. As a result, a flow rate of the dry gas introduced into the cover 35 by the gas introduction mechanism 45 can be suppressed. As such, in the present embodiment, the opening portion 35$d$ of the cover 35 which is configured to be rotated in a $\theta$ direction by the rotation driving unit 37 is closed by the fixed shield wall 43. Therefore, a specific driving mechanism for closing the opening portion 35$d$ is not required, so that the configuration of the transfer device 31 can be simplified. Further, between the fixed shield wall 43 and the rotating cover 35, there is a clearance for merely allowing the rotation without interference. Therefore, at the second rotation position, the inside of the cover 35 does not become an entirely airtight state by the shield wall 43. Accordingly, in the present invention, when mentioning "shielding" the inside of the cover 35 and "closing" the opening portion 35d, it does not mean an entirely airtight state.

The rotation position of FIG. 8 is a rotation position at which the transfer device 31 delivers the inspected wafer W to the loader unit 20 (e.g., FOUP F). This position referred to as a third rotation position in the present embodiment. At the third rotation position, the opening portion 35d of the cover 35 does not overlap with the shield wall 43 fixed to the base unit 39, and the transfer arm 33 can move forward and backward through the opening portion 35d.

(Transfer Method)

In the inspection system 100 of the present embodiment having the above configuration, a device test is sequentially performed with respect to a plurality of wafers W by transferring the wafers W between the inspection unit 10 having a plurality of test devices 13 and the loader unit by the transfer device 31. For example, in the inspection system 100, when the low temperature test on the wafer W is performed, a transfer method of the present embodiment may include, e.g., the following first to third steps.

(First Step)

In the first step, the inspected wafer W is received from the inspection unit 10. That is, the transfer device 31 receives the inspected wafer W from the inspection unit 10 by using the transfer arm 33 at a state where the transfer arm 33 and the cover 35 are at the first rotation position (see FIG. 3). In the first step, a dry gas is introduced into the cover 35 at a predetermined flow rate by the gas introduction mechanism 45. In the first step, the dry gas may be introduced before or after the transfer arm 33 receives the inspected wafer W from the inspection unit 10, or at the same time as the transfer arm 33 receives the inspected wafer W from the inspection unit 10. However, it is preferable that the dry gas is introduced into the cover 35 before the transfer arm 33 receives the inspected wafer W.

(Second Step)

In the second step, the inspected wafer W received from the inspection unit 10 is transferred toward the loader unit 20 at a state where the opening portion 35d of the cover 35 is shielded by the shield wall 43. That is, the transfer device 31 rotates the transfer arm 33 and the cover 35 from the first rotation position to the second rotation position (see FIG. 7) and transfers the wafer W held by the transfer arm 33 toward the loader unit 20 at the second rotation position. At the second rotation position, since entry of an ambient air into the cover 35 is blocked by the shield wall 43, the inside of the cover 35 is secured in a dry atmosphere by the dry air having been introduced or being introduced into the cover 35 by the gas introduction mechanism 45. Accordingly, even if a particular waiting time is not provided, a temperature of the inspected wafer W increases in a dry state while the inspected wafer W is being transferred toward the loader unit 20. Therefore, the transfer can be performed with a high throughput.

(Third Step)

In the third step, the inspected wafer W is delivered to the loader unit 20. That is, the transfer device 31 rotates the transfer arm 33 and the cover 35 from the second rotation position to the third rotation position (see FIG. 8), and delivers the wafer W held by the transfer arm 33 to the loader unit 20 at the third rotation position.

In the transfer method of the present embodiment, the above first to third steps can be performed under a control of the controller 40.

(Flow Rate Control of Dry Gas)

Next, a flow rate control of a dry gas in the transfer method of the present embodiment will be described with reference to FIGS. 9 to 11. In order to maintain the atmosphere in the cover 35 in a dry state during the low temperature test on the wafers W in the inspection system 100, it is preferable that the dry gas is continuously introduced by the gas introduction mechanism 45. However, immediately after the transfer arm 33 receives the inspected wafer W that has been cooled, condensation and congelation in the inspected wafer W may be easily generated. Moreover, it is not reasonable to continuously introduce a large amount of the dry gas while an uninspected wafer W is being transferred by the transfer device 31 or in a state where a wafer W is not accommodated in the cover 35. For this reason, in the inspection system 100 of the present embodiment, it is preferable that a flow rate of the dry gas introduced into the cover 35 is controlled to increase immediately before and immediately after the inspected wafer W is received by the transfer arm 33. The dry gas may be introduced into the cover 35 through one or both of the gas introduction unit 47A of the ceiling portion 35a of the cover 35 and the gas introduction unit 48A of the bottom portion 35b of the cover 35. A flow rate of the dry gas to be described hereinafter is a sum of a flow rate introduced through the gas introduction unit 47A and/or a flow rate introduced through the gas introduction unit 48A.

Figure 9:
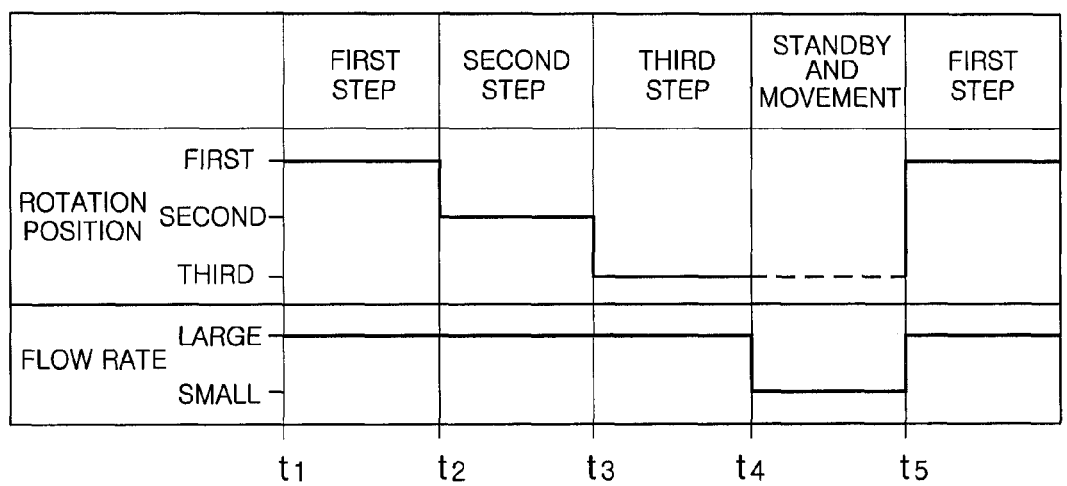
FIG. 9 is a timing chart for explaining an example of a flow rate control of a dry gas in a transfer method in accordance with the present embodiment.
Figure 10:
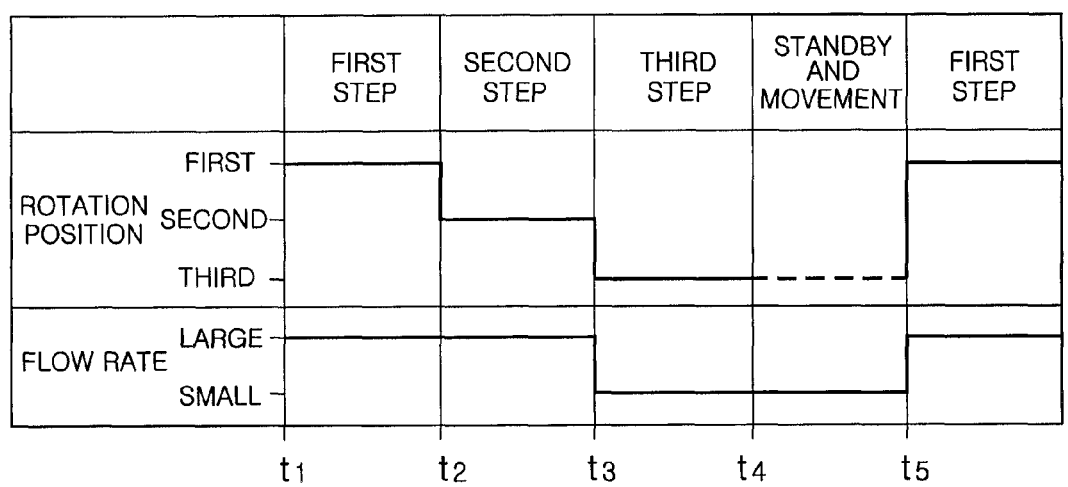
FIG. 10 is a timing chart for explaining another example of the flow rate control of the dry gas in the transfer method in accordance with the present embodiment.
Figure 11:
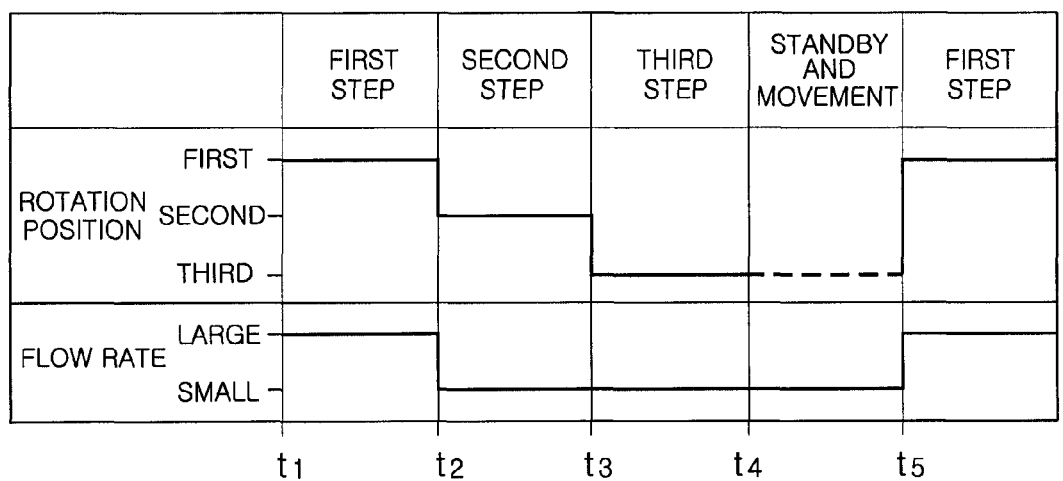
FIG. 11 is a timing chart for explaining still another example of the flow rate control of the dry gas in the transfer method in accordance with the present embodiment.

FIGS. 9 to 11 are timing charts showing a relationship between the rotation position of the transfer arm 33 and the cover 35 and a flow rate of the dry gas introduced by the gas introduction mechanism 45 into the cover 35. In FIGS. 9 to 11, the horizontal axis indicates time, wherein a time period from $t_1$ to $t_2$ expresses the first step, a time period from $t_2$ to $t_3$ expresses the second step, and a time period from $t_3$ to $t_4$ expresses the third step. Further, a time period from $t_1$ to $t_4$ indicates a period from when the transfer device 31 receives one or two inspected wafers W to when the transfer device 31 delivers the wafers W to the loader unit 20. A time period from $t_4$ to $t_5$ indicates a period of standby and movement until the transfer device 31 receives a newly inspected wafer W from the inspection unit 10. During the time period from $t_4$ to $t_5$, an uninspected wafer W is also delivered from the loader unit 20 to the inspection unit 10. After time $t_5$, the first to third steps are repeated with respect to the newly inspected wafers W. As shown in FIGS. 9 to 11, the transfer arm 33 and the cover 35 are at the first rotation position in the first step, at the second rotation position in the second step, and at the third rotation position in the third step.

In the modes shown in FIGS. 9 to 11, the flow rate of the dry gas may be set, e.g., as follows: with respect to a cover having a volume of about 50 L, the flow rate "Large" (large amount of flow rate) is set to 100-300 L/min, preferably to 150-250 L/min, and the flow rate "Small" (small amount of flow rate) is set to 0-80 L/min, preferably to 30-70 L/min. Herein, the flow rate of 0 means that the dry gas is not introduced. In FIGS. 9 to 11, in the period of standby and movement from time $t_4$ to time $t_5$ (including a state where an uninspected wafer W is accommodated in the cover 35 of the transfer device 31), the flow rate of the dry gas introduced by the gas introduction mechanism 45 into the cover 35 is preferably set to "Small" in an economic perspective.

In the mode shown in FIG. 9, in the first to third steps from time $t_1$ to time $t_4$, the dry gas is introduced into the cover 35 at a large flow rate by the gas introduction mechanism 45. Here, in the first step, the introduction of the dry gas may be started before or after the transfer arm 33 receives the inspected wafer W from the inspection unit 10, or at the same time as the transfer arm 33 receives the inspected wafer W from the inspection unit 10. However, it is preferable that the dry gas is introduced into the cover 35 before the transfer arm 33 receives the inspected wafer W. In the period of standby and movement from time $t_4$ to time $t_5$, the flow rate of the dry gas introduced by the gas introduction mechanism 45 into the cover 35 is set to a small amount to be relatively decreased compared to that in the time period from $t_1$ to $t_4$ or the supply of the dry gas is stopped. As such, from when the transfer arm 33 receives the inspected wafer W from the inspection unit 10 to when the transfer arm 33 delivers the wafer W to the loader unit 20, the dry gas is continuously introduced into the cover 35 at a large flow rate by the gas introduction mechanism 45. Accordingly, the inside of the cover 35 is consistently maintained in a dry atmosphere so that condensation and congelation in the wafer W held by the transfer arm 33 can be prevented.

In the mode shown in FIG. 9, since the rotation position of the cover 35 is changed from the first rotation position to the second rotation position at time $t_2$, the inside of the cover 35 becomes an almost airtight state by the shield wall 43 before time $t_3$. Therefore, the inside of the cover 35 is effectively maintained in a dry atmosphere by the introduced dry gas. Accordingly, while transferring the inspected wafer W toward the loader unit 20, condensation and congelation in the wafer W held by the transfer arm 33 can be reliably prevented by the dry gas of a large flow rate. Further, in the mode shown in FIG. 9, even if a particular waiting time is not provided, a temperature of the inspected wafer W increases in a dry state while the inspected wafer W is being transferred toward the loader unit 20, and thus the transfer can be performed with a high throughput.

In the mode shown in FIG. 10, in the first and second steps from time $t_1$ to time $t_3$, the dry gas is introduced into the cover 35 at a large flow rate by the gas introduction mechanism 45. Here, in the first step, the introduction of the dry gas may be started before or after the transfer arm 33 receives the inspected wafer W from the inspection unit 10, or at the same time as the transfer arm 33 receives the inspected wafer W from the inspection unit 10. However, it is preferable that the dry gas is introduced into the cover 35 before the transfer arm 33 receives the inspected wafer W. In the period of standby and movement from time $t_4$ to time $t_5$, the flow rate of the dry gas introduced by the gas introduction mechanism 45 into the cover 35 is set to a small amount to be relatively decreased compared to that in the time period from $t_1$ to $t_3$ or the supply of the dry gas is stopped. As such, while transferring the inspected wafer W toward the loader unit 20 from when the inspected wafer W is received from the inspection unit 10, the dry gas is continuously introduced into the cover 35 at a large flow rate by the gas introduction mechanism 45. Accordingly, the inside of the cover 35 is maintained in a dry atmosphere so that condensation and congelation in the wafer W held by the transfer arm 33 can be prevented.

Further, in the mode shown in FIG. 10, since the rotation position of the cover 35 is changed from the first rotation position to the second rotation position at time $t_2$, the inside of the cover 35 becomes an almost airtight state by the shield wall 43 before time $t_3$. Therefore, the inside of the cover 35 is effectively maintained in a dry atmosphere by the dry gas introduced until time $t_3$. Accordingly, in the mode of FIG. 10, condensation and congelation in the wafer W held by the transfer arm 33 can be prevented while saving a usage amount of the dry gas compared to that in the form of FIG. 9. Further, in the form shown in FIG. 10, even if a particular waiting time is not provided, a temperature of the inspected wafer W increases in a dry state while the inspected wafer W is being transferred toward the loader unit 20, and thus the transfer can be performed with a high throughput.

In the mode shown in FIG. 11, in the first step from time $t_1$ to time $t_2$, the dry gas is introduced into the cover 35 at a large flow rate by the gas introduction mechanism 45. Here, in the first step, the introduction of the dry gas may be started before or after the transfer arm 33 receives the inspected wafer W from the inspection unit 10, or at the same time as the transfer arm 33 receives the inspected wafer W from the inspection unit 10. However, it is preferable that the dry gas is introduced into the cover 35 before the transfer arm 33 receives the inspected wafer W. In the second and third steps from time $t_2$ to time $t_4$ and the period of standby and movement from time $t_4$ to time $t_5$, the flow rate of the dry gas introduced by the gas introduction mechanism 45 into the cover 35 is set to a small amount to be relatively decreased compared to that in the time period from $t_1$ to $t_2$ or the supply of the dry gas is stopped. As such, in the step of receiving the inspected wafer W from the inspection unit 10, the dry gas is introduced into the cover 35 at a large flow rate by the gas introduction mechanism 45. Accordingly, the inside of the cover 35 is maintained in a dry atmosphere so that condensation and congelation in the wafer W held by the transfer arm 33 can be prevented.

In the form shown in FIG. 11, after the dry gas is introduced into the cover 35 in the first step from time $t_1$ to time $t_2$, the rotation position of the cover 35 is changed from the first rotation position to the second rotation position at time $t_2$. Thus, the inside of the cover 35 becomes an almost airtight state by the shield wall 43 before time $t_3$. As a result, even if the introduction of the dry gas by gas introduction mechanism 45 is decreased or stopped at time $t_2$, an entry of an ambient air is suppressed, so that the inside of the cover 35 is maintained in a dry atmosphere. Accordingly, in the form shown in FIG. 11, condensation and congelation in the wafer W held by the transfer arm 33 can be prevented while minimizing a usage amount of the dry gas compared to those in the modes of FIGS. 9 and 10. Further, in the mode shown in FIG. 11, even if a particular waiting time is not provided, a temperature of the inspected wafer W increases in a dry state while the inspected wafer W is being transferred toward the loader unit 20, and thus the transfer can be performed with a high throughput.

As described above, in the inspection system 100 of the present embodiment having a plurality of test devices 13, condensation and congelation in the wafer W can be effectively prevented without deteriorating the throughput of the transfer by the transfer device 31.

The embodiment of the present invention has been described in detail for the purpose of an example, but the present invention is not limited to the above embodiment and may be variously modified. For example, in the above embodiment, the transfer arm 33 and the cover 35 are synchronously rotated in the horizontal plane by the rotation driving unit 37. However, the transfer arm 33 and the cover 35 may be independently rotated in the horizontal plane.

Further, the above embodiment has been described under a premise that the inspection unit 10 performs the low temperature test in each of the test devices 13. However, the present invention may be applied to a case where the room temperature test, the low temperature test and the high temperature test are performed in combination in the test devices 13 of the inspection unit 10.

Furthermore, in the above embodiment, the flow rate of the dry gas introduced into the cover 35 is switched between two steps of a large flow rate and a small flow rate including stop. However, the flow rate of the dry gas may be switched between three or more steps.

While the invention has been shown and described with respect to the embodiments, it will be understood by those skilled in the art that various changes and modifications may be made without departing from the scope of the invention as defined in the following claims.

What is claimed is:

1. A transfer method for transferring a substrate in an inspection system configured to test electrical characteristics of the substrate, the inspection system comprising: an inspection unit comprising a plurality of test devices configured to test on the electrical characteristics of a substrate; a loader unit configured to mount a cassette configured to accommodate a plurality of substrates; and a transfer device configured to transfer a substrate between the inspection unit and the loader unit, wherein the transfer device comprises: a transfer arm rotatable in a horizontal plane and operable to hold a substrate; a transfer arm container having an opening portion allowing the transfer arm to move through forward and backward and configured to be rotatable in a horizontal plane and to cover the transfer arm; and a shield member arranged outside the transfer arm container and configured to switch the opening portion between an open state and a closed state by rotating the transfer arm container, the transfer method comprising:
receiving an inspected substrate from the inspection unit;
transferring the inspected substrate received from the inspection unit toward the loader unit in a state where the opening portion is shielded by the shield member; and
delivering the inspected substrate to the loader unit,
wherein said receiving the inspected substrate comprises setting the transfer arm and the transfer arm container to a first rotation position,
wherein said transferring the inspected substrate comprises setting the transfer arm container to a second rotation position which is different from the first rotation position and at which an entirety of the opening portion is shielded by the shield member,
wherein said delivering the inspected substrate comprises setting the transfer arm and the transfer arm container to a third rotation position which is different from the first and the second rotation positions.

2. The transfer method of claim 1 further comprising the shield member covering the opening portion when the transfer arm container is at the second rotation position.

3. The transfer method of claim 1, wherein the transfer device further comprises a gas introduction mechanism configured to introduce a dry gas into the transfer arm container, and further comprising: the gas introduction mechanism introducing no dry gas or introducing the dry gas at a first flow rate into the transfer arm container when an uninspected substrate is accommodated in the transfer arm container; and the gas introduction mechanism introducing the dry gas at a second flow rate larger than the first flow rate into the transfer arm container during at least said receiving the inspected substrate.

4. The transfer method of claim 1, wherein the transfer device further comprises a gas introduction mechanism configured to introduce a dry gas into the transfer arm container, and further comprising the gas introduction mechanism introducing no dry gas or introducing the dry gas at a first flow rate into the transfer arm container when an uninspected substrate is accommodated in the transfer arm container; and the gas introduction mechanism introducing the dry gas at a second flow rate larger than the first flow rate into the transfer arm container during at least said receiving the inspected substrate.

5. The transfer method of claim 2, wherein the transfer device further comprises a gas introduction mechanism configured to introduce a dry gas into the transfer arm container, and further comprising the gas introduction mechanism introducing no dry gas or introducing the dry gas at a first flow rate into the transfer arm container when an uninspected substrate is accommodated in the transfer arm container; and the gas introduction mechanism introducing the dry gas at a second flow rate larger than the first flow rate into the transfer arm container during at least said receiving the inspected substrate.

6. The transfer method of claim 3 further comprising the gas introduction mechanism continuously maintaining the second flow rate during said transferring the inspected substrate or during said transferring the inspected substrate and said delivering the inspected substrate.

7. The transfer method of claim 4 further comprising the gas introduction mechanism continuously maintaining the second flow rate during said transferring the inspected substrate or during said transferring the inspected substrate and said delivering the inspected substrate.

8. The transfer method of claim 5 further comprising the gas introduction mechanism continuously maintaining the second flow rate during said transferring the inspected substrate or during said transferring the inspected substrate and said delivering the inspected substrate.

9. An inspection system for testing electrical characteristics of a substrate, the inspection system comprising:
an inspection unit comprising a plurality of test devices configured to test the electrical characteristics of the substrate;
a loader unit configured to mount a cassette configured to accommodate a plurality of substrates;
a transfer device configured to transfer the substrate between the inspection unit and the loader unit; and
a controller configured to control the transfer device,
wherein the transfer device comprises:
a transfer arm rotatable in a horizontal plane and operable to hold the substrate;
a transfer arm container configured to cover the transfer arm and having an opening portion through which the transfer arm moves forward and backward, the transfer arm container being rotatable in a horizontal plane;
a shield member arranged outside the transfer arm container and configured to switch the opening portion between an open state and a closed state by rotating the transfer arm container; and
a gas introduction mechanism configured to introduce a dry gas into the transfer arm container,
wherein the controller comprises:
a rotation control unit configured to control rotation of the transfer arm and the transfer arm container; and
a gas introduction control unit configured to control introduction of the dry gas performed by the gas introduction mechanism,
wherein, when the transfer device receives an inspected substrate from the inspection unit, the rotation control unit is configured to set the transfer arm and the transfer arm container at a first rotation position,
wherein, when the inspected substrate received from the inspection unit is transferred toward the loader unit, the rotation control unit is configured to set the transfer arm container at a second rotation position which is different from the first rotation position and at which an entirety of the opening portion is shielded by the shield member, and wherein, when the inspected substrate is delivered to the loader unit, the rotation control unit is configured to set the transfer arm and the transfer arm container at a third rotation position which is different from the first and the second rotation position.

10. The inspection system of claim 9, wherein the shield member is a wall configured to shield the opening portion by covering the opening portion when the transfer arm container is at the second rotation position.

11. The inspection system of claim 9, wherein the gas introduction control unit is configured to control the gas introduction mechanism to introduce no dry gas or introduce the dry gas at a first flow rate into the transfer arm container when an uninspected substrate is accommodated in the transfer arm container, and to introduce the dry gas at a second flow rate larger than the first flow rate into the transfer arm container when at least the transfer arm container is at the first rotation position.

12. The inspection system of claim 10, wherein the gas introduction control unit is configured to control the gas introduction mechanism to introduce no dry gas or introduce the dry gas at a first flow rate into the transfer arm container when an uninspected substrate is accommodated in the transfer arm container, and to introduce the dry gas at a second flow rate larger than the first flow rate into the transfer arm container when at least the transfer arm container is at the first rotation position.

13. The inspection system of claim 11, wherein the gas introduction control unit is configured to control the gas introduction mechanism to continuously maintain the second flow rate when the transfer arm container is at the second rotation position or when the transfer arm container is at the second rotation position and the third rotation position.

14. The inspection system of claim 12, wherein the gas introduction control unit is configured to control the gas introduction mechanism to continuously maintain the second flow rate when the transfer arm container is at the second rotation position or when the transfer arm container is at the second rotation position and the third rotation position.

15. The transfer method of claim 1, wherein the transfer device further comprises a gas introduction mechanism configured to introduce a dry gas into the transfer arm container, and wherein said transferring the inspected substrate comprises introducing the dry gas into the transfer arm container by the gas introduction mechanism.

16. The inspection system of claim 9, wherein the controller is configured to control the transfer device to introduce the dry gas in a state where the opening portion of the transfer arm container is shielded by the shield member.

* * * * *